United States Patent [19]
Hsu et al.

[11] Patent Number: 5,978,283
[45] Date of Patent: Nov. 2, 1999

[54] CHARGE PUMP CIRCUITS

[75] Inventors: Fu-Chang Hsu; Hsing-Ya Tsao, both of Taipei, Taiwan; Peter Wung Lee, Saratoga, Calif.

[73] Assignee: Aplus Flash Technology, Inc., Santa Clara, Calif.

[21] Appl. No.: 09/109,652

[22] Filed: Jul. 2, 1998

[51] Int. Cl.$^6$ .................................. G11C 7/00; G05F 3/16
[52] U.S. Cl. .................... 365/189.09; 365/226; 327/536; 327/537
[58] Field of Search .............................. 365/189.09, 226; 327/534, 536, 537

[56] References Cited

U.S. PATENT DOCUMENTS

| | | | |
|---|---|---|---|
| 5,422,590 | 6/1995 | Coffman et al. | 327/537 |
| 5,489,870 | 2/1996 | Arakawa | 327/536 |
| 5,734,290 | 3/1998 | Chang et al. | 327/536 |
| 5,821,805 | 10/1998 | Jinbo | 327/537 |
| 5,828,095 | 10/1998 | Merritt | 257/299 |

Primary Examiner—Son Mai

[57] ABSTRACT

Charge pump circuits for stepping up high voltages for flash memory array are disclosed. A first circuit comprises a plurality of series-coupled charge pumps having pump capacitors connected to each pump stage. A first group of charge pumps of the pump circuit are AC coupled through pump capacitors to two non-overlapping pulse trains. To reduce the high voltage that a pump capacitor has to withstand, each pump capacitor after the first group is connected to an earlier pump stage instead of the non-overlapping pulse trains. Therefore, the charge pump circuit can output voltage higher than the breakdown voltage of the pump capacitors. A second circuit comprising a configurable charge pump circuit is also presented. By connecting selected pump stages through diode paths to the output of the charge pump circuit and having a plurality of pulse train inputs, the charge pump circuit can be configured as a high voltage low current charge pump or a low voltage high current charge pump dependent on how pulse train signals are provided to the pulse train inputs. Finally, an improved structure for pump capacitors used in the charge pump circuit is presented.

18 Claims, 7 Drawing Sheets

| PULSE STAGES | P1 | P2 | P3 | P4 | P5 | P6 | P7 | P8 |
|---|---|---|---|---|---|---|---|---|
| 1 | Φ1 | Φ1 | Φ1 | Φ1 | Φ1 | Φ1 | Φ1 | Φ1 |
| 2 | Φ1 | Φ2 | Φ2 | Φ1 | Φ1 | Φ2 | Φ2 | Φ1 |
| 4 | Φ1 | Φ2 | Φ1 | Φ2 | Φ2 | Φ1 | Φ2 | Φ1 |
| 8 | Φ1 | Φ2 | Φ1 | Φ2 | Φ1 | Φ2 | Φ1 | Φ2 |

CHARGE PUMP CIRCUITS

FIELD OF THE INVENTION

The present invention relates to charge pump circuits that step up voltage levels for programming or erasing flash memory circuits, and more specifically to the structures of charge pump circuits.

BACKGROUND OF THE INVENTION

Flash memory devices have been widely used in computer related equipment and other electronic appliances as storage devices. The nonvolatile and on-chip programmable capabilities of a flash memory are very important for storing data in many applications. As an example, flash memories are frequently used for the BIOS storage of a personal computer. In addition, the small physical size of flash memories also makes them very suitable for portable applications. Therefore, they have been used for storing programs and data for many portable electronic devices such as cellular phones, digital cameras and video game platforms.

A flash memory array circuit requires high positive or negative voltage to program and erase its memory cells. Typically, charge pump circuits are built in an integrated circuit along with a flash memory array to provide the high voltages. In order to supply high voltages and adequate current, two or three pump circuits with fairly large circuit areas are commonly included in a flash memory array circuit.

FIG. 1 shows a popular conventional charge pump circuit having eight pump stages. In the circuit structure as shown, two-phase non-overlapping pulse trains $\Phi 1$ and $\Phi 2$ are provided, for example from a pulse generator. By non-overlapping it is meant that 0 to 1, and 1 to 0 voltage transitions of one pulse never overlap with transitions of the other pulse, although duty cycle of the two pulses is not critical. As shown in FIG. 1, each waveform has a 0 to 1 voltage differential E1 that typically is equal to a power supply voltage Vdd.

The initial voltage at node A1 is Vdd−Vt, where Vt is a threshold voltage drop across M1. The rising edge of waveform $\Phi 1$ AC-couples through capacitor C1 to superimpose a positive transition of magnitude E1 upon the voltage at A1, raising the peak voltage at A1 to Vdd+Vdd−Vt.

Node A2 follows the potential at A1 less a threshold voltage drop Vt. Therefore, the voltage at A2 is Vdd+Vdd−Vt−Vt. However, the positive-rising transition of the $\Phi 2$ waveform AC-couples through capacitor C2 to initially superimpose an E1 transistion on node A2, increasing the peak voltage at node A2 to Vdd+Vdd+Vdd−Vt−Vt. Comparing the peak voltage at A2 to A1, the circuit pumps up the voltage level by a magnitude of Vdd−Vt.

Similarly, the peak voltage at each node A3, A4, . . . , A8 is also pumped up by Vdd−Vt as compared to its preceding node. As shown in FIG. 1, the eight stage charge pump circuit can output a peak voltage of Vdd+8*(Vdd−Vt) ideally. If Vdd is assumed to be 3 VDC and Vt is assumed to be 1 VDC, the output of the charge pump circuit can reach a peak voltage of 19 VDC. In practice, Vt may be much higher than 1 VDC if body effect is present. The output voltage can be much lower than 19 VDC realistically even if the device and capacitors can sustain more than 19 VDC.

The charge pump circuit as shown in FIG. 1 has a major drawback in that the capacitors in the later stages such as C5, C6, C7 and C8 must be able to withstand very high voltage to avoid being broken down if the trend of technology requires lower device breakdown voltage such as 12 VDC. Therefore, the voltage level that can be provided by the conventional pump circuit is limited by the pump capacitor junction breakdown voltage and oxide breakdown voltage.

A charge pump circuit for providing a high voltage requires many pump stages to step up the voltage level. Each stage has a pump capacitor and a diode associated with it. Therefore, to output high voltage it is necessary to fabricate the charge pump circuit and diode with thick oxide layers that are usually not desirable in manufacturing flash memory array.

The pump capacitor used in a charge pump circuit is usually constructed by connecting together the drain and source of a MOS transistor. There exists a channel turn-off problem in a MOS capacitor. When the channel is on, the full gate oxide of the transistor is used as the capacitor. However, when the channel is off, the gate is equivalently connected to two capacitors, a source which has much smaller overlap with the gate and a gate-substrate overlap capacitor. FIG. 2 illustrates an N-MOS pump capacitor that has a channel turn-off problem.

The gate-substrate overlap capacitor behaves like a parasitic capacitor connecting to ground. Therefore, the coupling ratio from the source to the gate is as low as 10%. As a result, the pump capacitor can work only when the MOS channel is turned on. The efficiency of the pump circuit is degraded.

Another issue is related to the supply current of a high voltage level. As an example, during the initialization for memory programming, a high stage charge pump with 100 $\mu$A current may be needed to quickly step up the 10 VDC within a reasonable time.

Although after the initialization a low stage charge pump providing 5 VDC with 1 mA and a high stage charge pump providing 10 VDC with 100 nA are sufficient to sustain the programming, a high stage charge pump having very large circuit area has to be built in order to provide enough current for the initialization.

SUMMARY OF THE INVENTION

The present invention has been made to overcome the above mentioned drawbacks of conventional charge pump circuits. In one embodiment, the invention provides a charge pump circuit that can generate voltage higher than the capacitor oxide breakdown voltage. In the other embodiment, the invention provides a configurable circuit for serving as a high-stage or low-stage charge pump circuit.

A first embodiment of the charge pump circuit of this invention is a two-phase high voltage generator circuit. The pump capacitors of a first group of pump stages in the circuit are connected to two non-overlapping pulse train inputs as in a conventional circuit.

After the first group of pump stages, each pump capacitor of a pump stage is connected to an earlier stage so that the pump capacitor effectively shunts across a fixed number of pump stages. The number of stages that the pump capacitor shunts across is identical to the number of stages in the first group of pump stages. Therefore, each pump capacitor and its associated diode only have to withstand the voltage difference across those stages.

A second embodiment of this invention provides a charge pump circuit that can be configured as either a high voltage low current pump circuit or a low voltage high current pump circuit. According to this invention, a diode path is provided for connecting a pump stage to the output of the pump circuit to make the circuit configurable. Which stage should have a diode path connecting to the output depends on the desired configurations of the pump circuit.

By providing proper pulse trains to each stage, the pump stages can be configured in parallel to provide low voltage but high current output or in serial to provide high voltage but low current output. In a most flexible configuration, an eight stage pump circuit can be configured as a single stage, two stage, four stage or eight stage charge pump circuit to provide different level of voltage by using appropriate pumping pulse trains.

As mentioned earlier, the pump capacitor in the pump circuit has a channel turn-off problem. This invention also provides a new capacitor fabricated in a well within a device substrate for avoiding the conventional channel turn-off invention. Accordingly, the charge pump circuit can be pumping up voltage even if the gate associated with an N-MOS pump capacitor has a negative voltage.

DETAILED DESCRIPTION OF THE PREFERRED EMBODIMENTS

Figure 3:
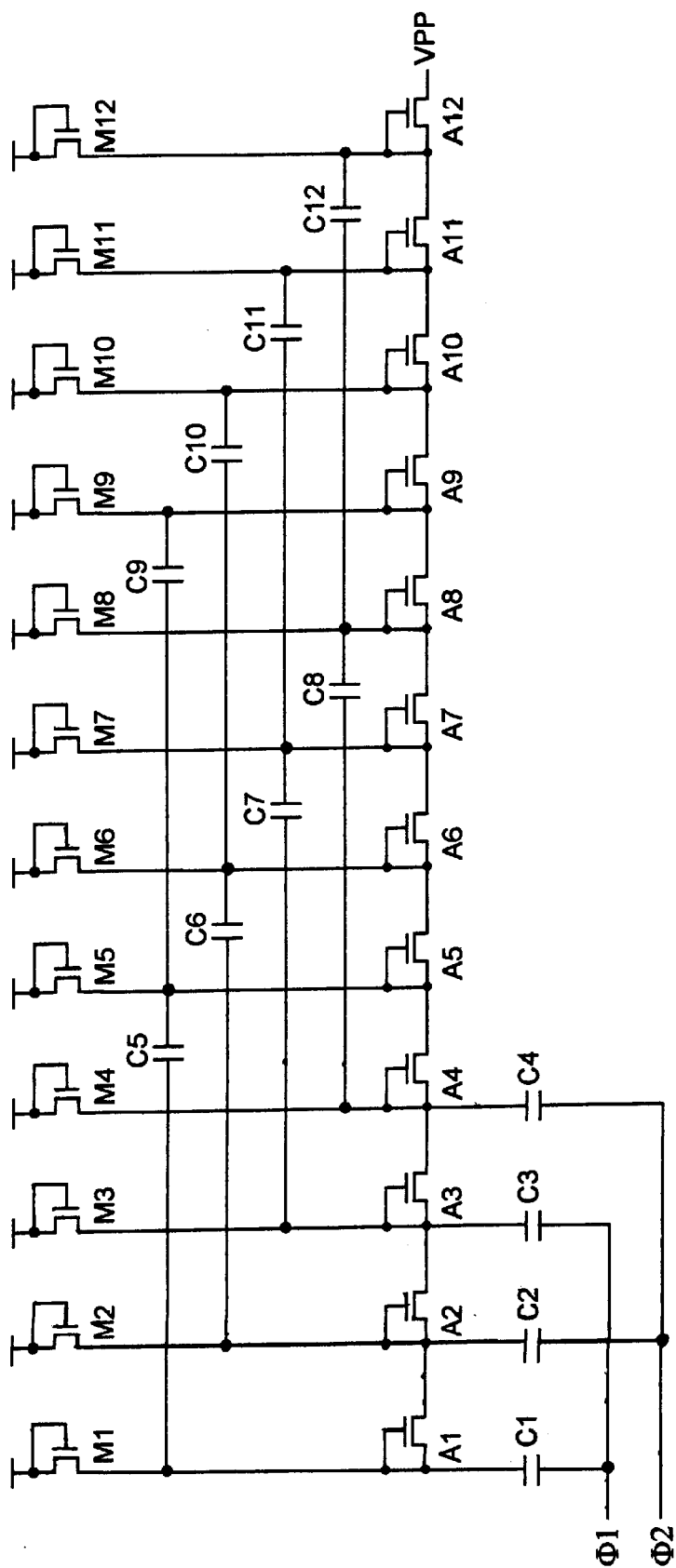
FIG. 3 shows the circuit diagram of the charge pump circuit in a first embodiment of this invention.

With reference to FIG. 3, the charge pump circuit of a first preferred embodiment of this invention comprises a plurality of pump stages. The example shown in FIG. 3 contains twelve stages. Nodes A1, A2, . . . , A12 are the input nodes to different stages.

Pump stages with nodes A1, A2, A3 and A4 form a first group of stages. C1, C2, C3 and C4 are pump capacitors connecting to A1, A2, A3 and A4 respectively. Two non-overlapping pulse trains Φ1 and Φ2 are provided to the pump circuit. The two pulse trains are 180 degrees out of phase. The peak level of the pulse train E1 typically is equal to the power supply voltage Vdd. The circuits for generating the pulse trains are well known and is not shown.

A1 and A3 are fed with the pulse train Φ1 while A2 and A4 are fed with the pulse train Φ2. The initial voltage at node A1 is Vdd−Vt, where Vt is a threshold voltage drop across M1. The rising edge of waveform Φ1 AC-couples through capacitor C1 to superimpose a positive transition of magnitude E1 upon the voltage at A1, raising the peak voltage at A1 to Vdd+Vdd−Vt.

Node A2 follows the potential at A1 less a threshold voltage drop Vt. Therefore, the voltage at A2 is Vdd+Vdd−Vt−Vt. However, the positive-rising transition of the Φ2 waveform AC-couples through capacitor C2 to initially superimpose an E1 transistion on node A2, increasing the peak voltage at node A2 to Vdd+Vdd+Vdd−Vt−Vt.

Comparing the peak voltage at A2 to A1, a pump stage steps up the voltage by a magnitude of Vdd−Vt. Similarly, the peak voltages at nodes A3 and A4 are stepped up and it can be expected that the peak voltage at A4 may reach Vdd+4*(Vdd−Vt).

The voltage at node A5 follows the voltage at node A4 less the threshold voltage Vt. As shown in FIG. 3, instead of being connected directly to the pulse train Φ1, the pump capacitor C5 connects node A5 to node A1. Ideally, the rising edge of the pulse train Φ1 AC couples through C1 and C5 to superimpose an E1 transition on the voltage at node A5. Consequently, the peak voltage at node A5 may also reach Vdd+5*(Vdd−Vt).

Similarly, each following pump stage also steps up the peak voltage by Vdd−Vt. As can be seen from FIG. 3, each pump capacitor C5, C6, . . . , C12 connects two nodes that are four nodes away from each other. Therefore, the maximum voltage level that each of the pump capacitors has to withstand never exceeds the voltage difference across four pump stages which is about 4* (Vdd−Vt).

Figure 1:
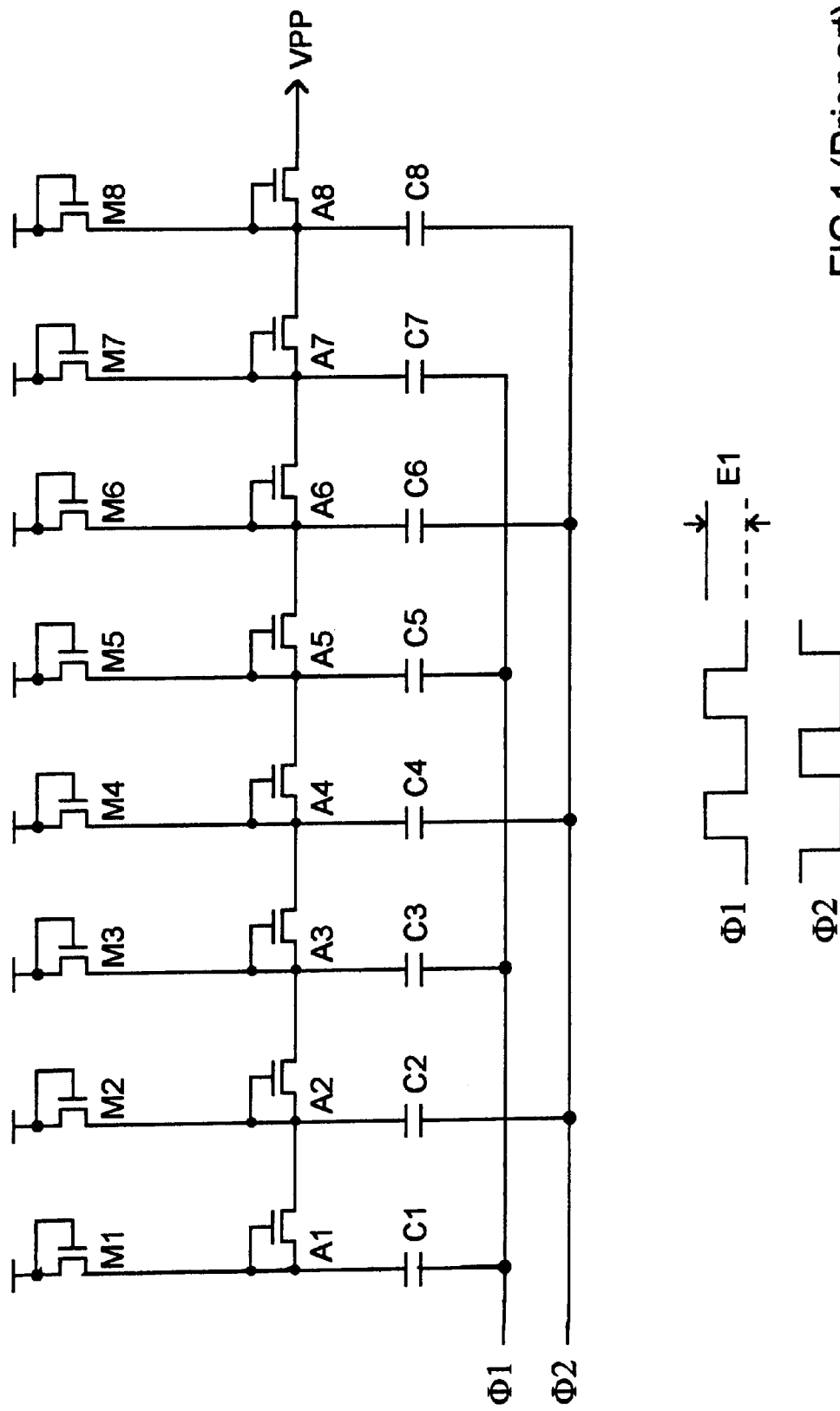
FIG. 1 shows the circuit diagram of a conventional charge pump circuit.
Figure 2:
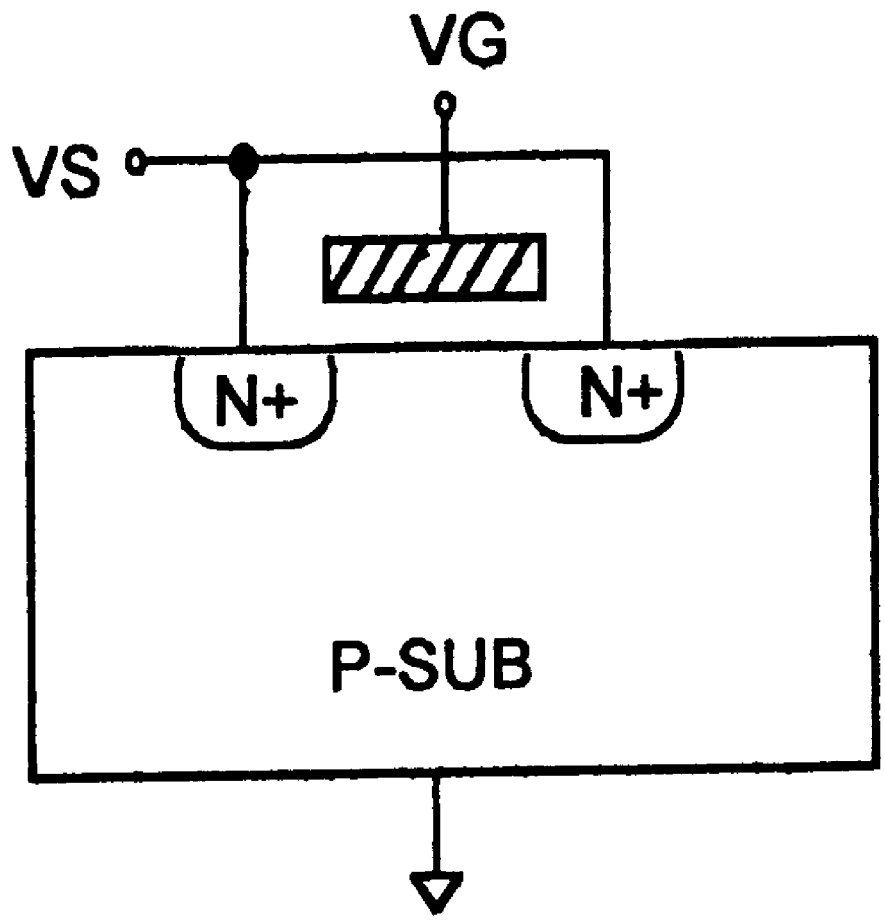
FIG. 2 shows a cross sectional view of a conventional N-MOS capacitor used in a charge pump circuit.

From the forgoing discussion, it can be seen that the circuit embodiment can step up the voltage level almost identically to a conventional charge pump circuit of FIG. 1. In the conventional circuit, however, a pump capacitor CN has to withstand a peak voltage level as high as Vdd+N*(Vdd−Vt) of node N.

In practice, due to the coupling loss in the pump capacitor and the pump stages that the pump capacitor shunts across, the step-up voltage level of each stage may be less than Vdd−Vt. Nevertheless, the breakdown voltage of the pump capacitor no longer becomes a limiting factor in the number of stages that a charge pump circuit can comprise. Or, in other words, to step up a same voltage level, the oxide layer of the pump capacitor in this invention can be made thinner.

Although four stages are illustrated in the first group of pump stages in the discussion, any number of stages can be used for the first group in the circuit of this embodiment. Nevertheless, it is preferred that an even number of stages be designed so that appropriate pulse trains can be easily applied. Furthermore, in FIG. 3, each node is shown to connect through a MOS device to Vdd that provides an initial voltage to increase the speed of charge pumping. The connection to Vdd is optional.

Figure 4A:
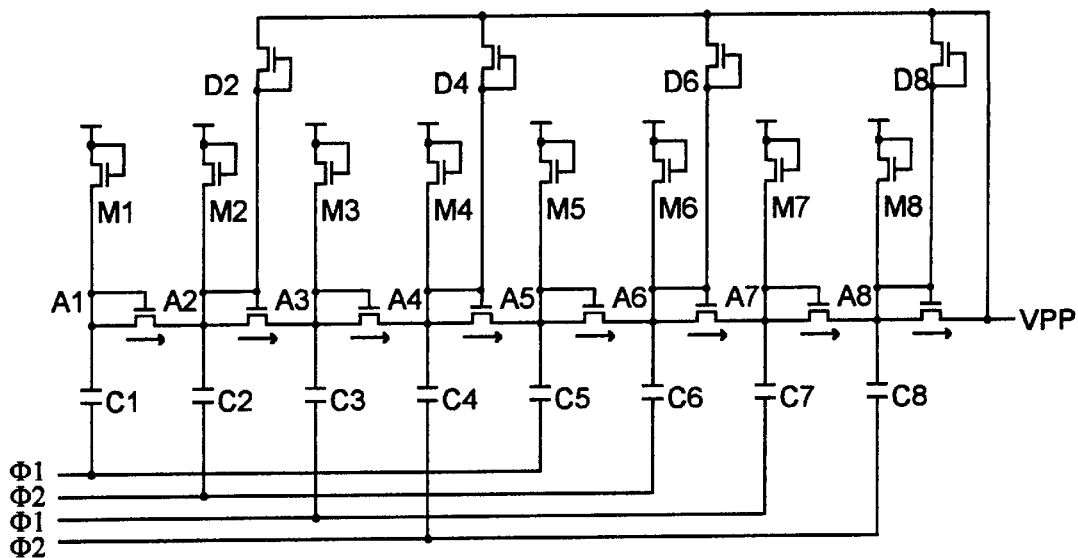
FIG. 4A shows the circuit diagram and the pulse trains for configuring the charge pump circuit in a second embodiment of this invention as a high voltage low current pump circuit.

The charge pump circuit of a second embodiment of this invention is a configurable charge pump circuit. To make it configurable, selected pump stages may be provided diode paths connecting to the output of the charge pump circuit. FIG. 4A illustrates an example of a first configuration of an eight stage charge pump circuit of the second embodiment.

With reference to FIG. 4A, the circuit comprises eight nodes A1, A2, . . . , A8. Four pulse trains shown in the figure are provided to the circuit. A first pulse train comprising Φ1 is provided to A1 and A5 through C1 and C5 respectively. A second pulse train comprising Φ2 is provided to A2 and A6 through C2 and C6 respectively.

A third pulse train comprising Φ1 is provided to A3 and A7 through C3 and C7 respectively. A fourth pulse train comprising Φ2 is provided to A4 and A8 through C4 and C8 respectively. Although the first and third pulse train inputs all comprise Φ1, they are not connected together to make them configurable. For the same reason, the second and fourth pulse train inputs are not connected together.

The basic principle of the charge pump circuit in FIG. 4A is similar to a conventional two non-overlapping pulse pump circuit as shown in FIG. 1 and described earlier. The novelty of the invention is the diode paths D2, D4, D6 and D8 that connect A2, A4, A6 and A8 to the output of the pump circuit as shown in FIG. 4A.

In this circuit structure, during the charge pumping process, the current is not only transferred stage by stage but also transferred through the parallel diode paths while the output of the pump circuit is still lower than the voltage at node A2, A4, A6 or A8. As a result, the output voltage rises faster than a conventional charge pump circuit.

Figure 4B:
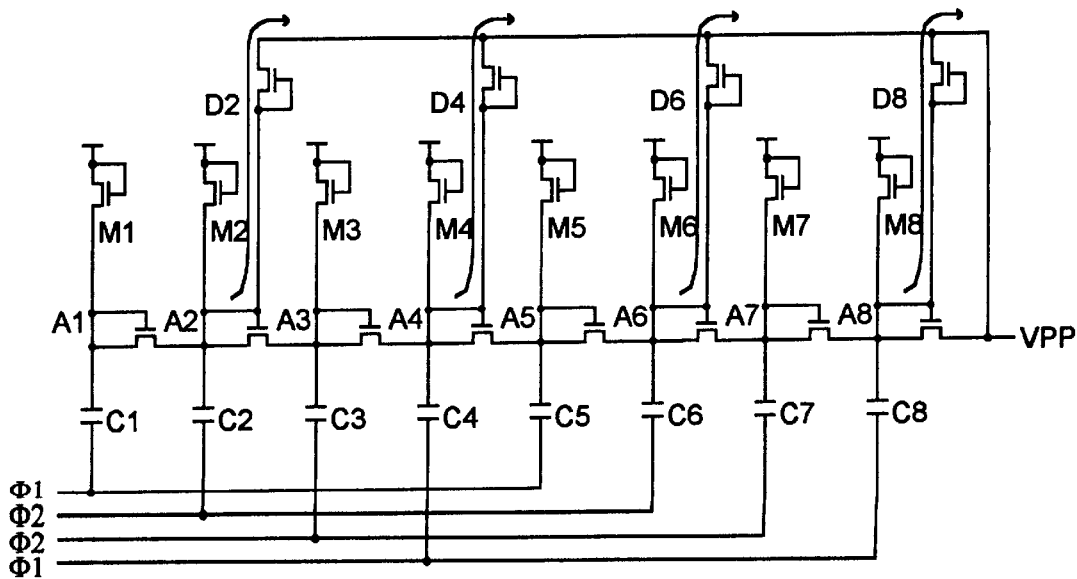
FIG. 4B shows the circuit diagram and the pulse trains for configuring the charge pump circuit in a second embodiment of this invention as a low voltage high current pump circuit.

As pointed out earlier, the four pulse trains are provided separately for the purpose of being configurable. FIG. 4B illustrates a second configuration of an eight stage charge pump circuit of the second embodiment. The circuit in FIG. 4B is identical to that in FIG. 4A. However, the pulse train inputs have been configured differently.

The third pulse train comprising Φ2 are provided to nodes A3 and A7. The fourth pulse train comprising Φ1 are provided to nodes A4 and A8. Because node 2 and node 3 have identical input pulse trains, the pump stage of node 2 does not transfer current to its next stage. Instead, the current is transferred through the diode path D2 to the output of the pump circuit. Consequentially, node 1 and node 2 form a two stage charge pump.

For the same reason, the pump stage of node 4 does not transfer current to the next stage. Node 3 and node 4 form a two stage charge pump that transfer current through D4 to the output of the pump circuit. Similarly, Node 5 and node 6 form a two stage charge pump and node 7 and node 8 form another two stage charge pump. Therefore, four parallel two stage charge pumps are formed with the four parallel diode paths.

As described above, the charge pump circuit of the second embodiment shown in FIG. 4A and 4B can be configured as either an eight stage or a two-stage charge pump cirucit by providing four diode paths to the output and configuring different pulse trains to the four pulse train inputs. If more diode paths and pulse train inputs are provided, the number of different configurations can be further increased.

Figure 5:
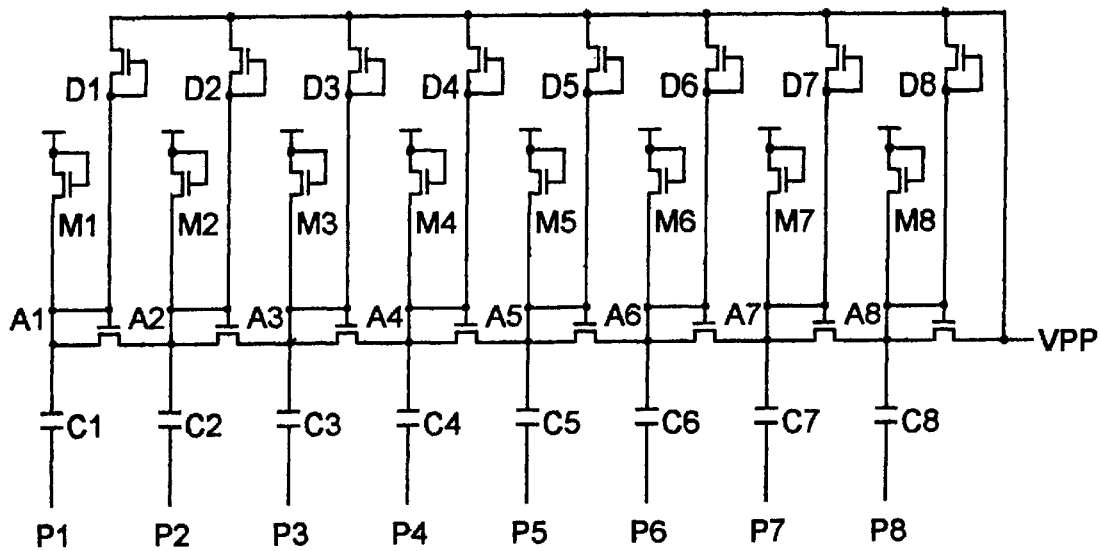
FIG. 5 illustrates an eight stage configurable pump circuit of this invention and the pulse trains to configure it as a one-stage, two-stage, four-stage or eight-stage charge pump circuit.
Figure 5:
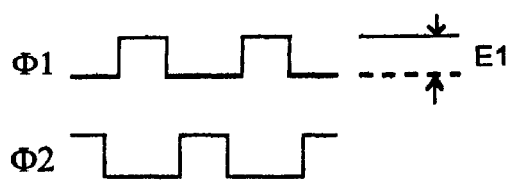

FIG. 5 illustrates an eight stage configurable charge pump circuit according to this invention. In the circuit structure of FIG. 5 each stage except the last stage comprises a diode path connecting its node to the output of the circuit. Whether the last stage has a diode path is not critical in that the stage is directly connected to the output. Although FIG. 5 does not show a diode path for the last stage, a diode path may be constructed for the last stage. Eight separate pulse train inputs are provided for AC coupling pulse trains through pump capacitors C1, C2, . . . , C8 to nodes A1, A2, . . . , A8.

According to the circuit structure of FIG. 5, the charge pump circuit can be configured as a one-stage, two-stage, four-stage or eight-stage pump circuit. If each pulse train input comprises the same pulse train Φ1, no node can transfer charge current to its next stage except the last node A8. Therefore, each stage except the last stage transfers current through a diode path D1, D2, . . . , D7 to the output of the pump circuit. As a result, seven parallel diode paths in parallel with the last stage form eight parallel one-stage charge pumps.

If the pulse train inputs connected to C1, C4, C5 and C8 comprise Φ1 and the pulse train inputs connected to C2, C3, C6 and C7 comprise Φ2, pump stages of nodes A2, A4 and A6 can not transfer current to their respect next stages having nodes A3, A5 and A7. Effectively four parallel two-stage charge pumps are formed in the circuit of FIG. 5.

If the pulse train inputs connected to C1, C3, C6 and C8 comprise Φ1 and the pulse train inputs connected to C2, C4, C5 and C7 comprise Φ2, stages of node A4 can not transfer current to its next stage having node A5. Consequently, two parallel four-stage charge pumps are formed in the circuit of FIG. 5.

If the pulse train inputs connected to C1, C3, C5 and C7 comprise Φ1 and the pulse train inputs connected to C2, C4, C6 and C8 comprise Φ2, the circuit behaves similarly to a conventional eight-stage charge pump. Nevertheless, the diode paths formed by D1, D2, . . . , D7 allow each stage to transfer current to the output of the pump circuit when the voltage at the stage is still higher than the output voltage. Therefore, the output voltage rises much faster than a conventional circuit and the pump efficiency is improved.

As pointed out in the background of the invention, a flash memory array has different requirements in supply voltage and current at different point of time. Take a flash memory array that requires a 10 VDC and 5 VDC as an example. In sustaining the bias condition of programming the memory cells, it is necessary to have 100 nA and 1 mA supply current for the 10 VDC and 5 VDC voltage. However, during the initialization for programming, 100 nA current would take too long for a charge pump circuit to step up the 10 VDC.

To pump up the 10 VDC within a reasonable time such as 1 micro second, it may require 100 μA. If the power supply voltage is 3 VDC, at least two different charge pumps are required to step up the power supply voltage to the voltage levels of 10 VDC and 5 VDC respectively. Therefore, a high stage charge pump for supplying 100 μA at 10 VDC and a low stage charge pump for supplying 1 mA at 5 VDC are typically designed and built in the flash memory circuit of this example.

Because of the case of initially higher current requirement in the 10 VDC, the charge pump circuit has to be fabricated with large capacitance which requires large circuit area. A significant area in a flash memory chip is therefore taken by the two charge pumps in the above example. Hence, the overall memory cell density is reduced.

This invention provides a different approach in coping with the current and voltage requirements in a flash memory array. According to the configurable charge pump circuit of the second embodiment of this invention, a charge pump circuit may be configured as a high-stage or low-stage charge pump. For the example just described, only a high stage charge pump for supplying 100 nA at 10 VDC and a configurable charge pump for supplying 1 mA at 5 VDC have to be designed and built in the chip with the present invention.

During the initialization, the configurable charge pump for supplying 1 mA at 5 VDC can be configured as a high-stage charge pump for supplying 100 μA at 10 VDC. After the initialization, the configurable charge pump is reconfigured as a low-stage charge pump for supplying 1 mA at 5 VDC and the other high stage charge pump is switched in for supplying 100 nA at 10 VDC to sustain the program of the memory cells.

According to this invention, the high stage charge pump for supplying 100 nA at 10 VDC requires a very small circuit area that is about 1/1000 of a high stage charge pump for supplying 100 μA at 10 VDC. The dramatic saving in circuit area can be easily seen. Although the configurable charge pump adds more complexity as compared to a conventional low-stage charge pump, the increase in circuit area is not significant because of the dominating factor in high current requirement of this 5 VDC charge pump.

Figure 6:
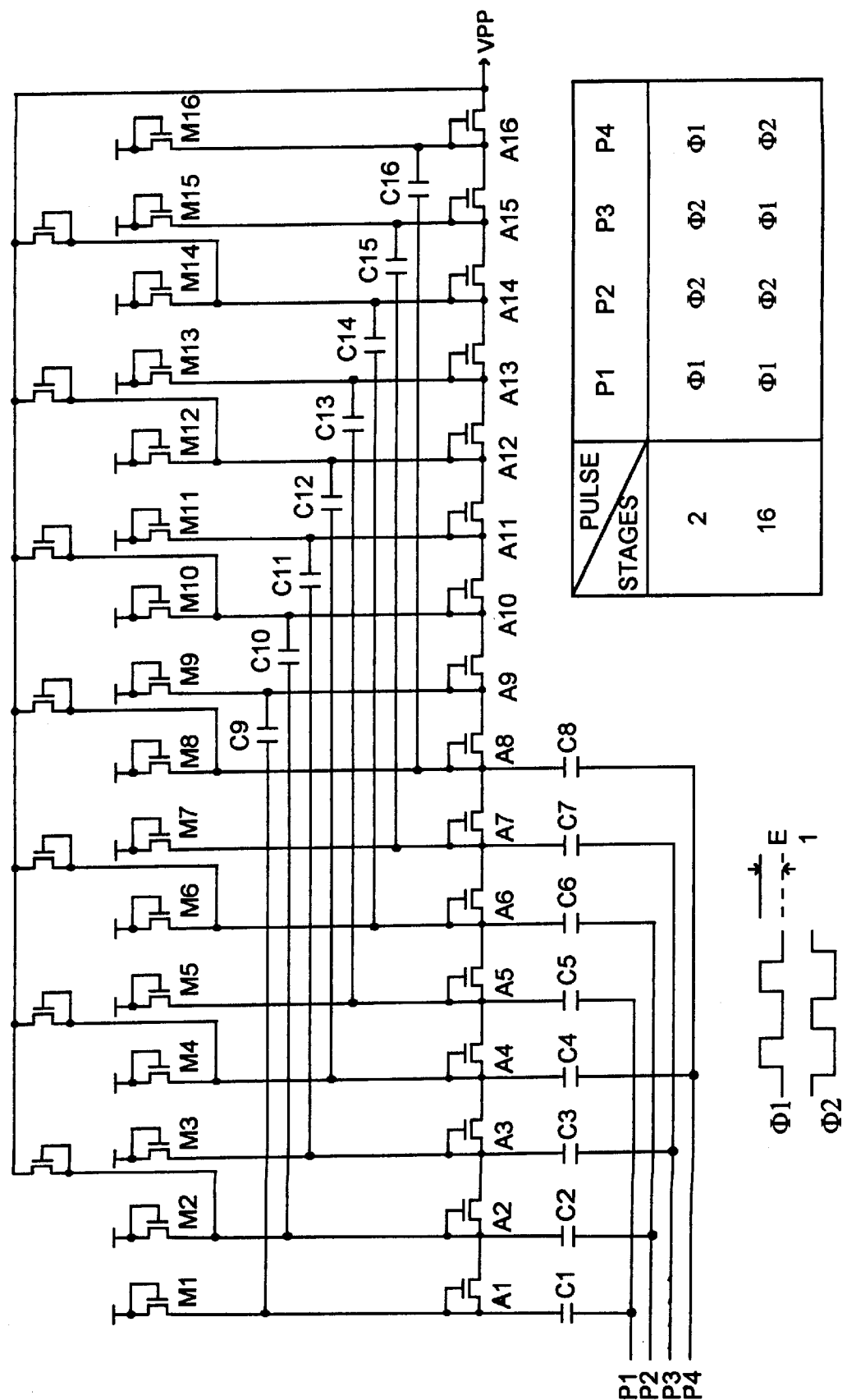
FIG. 6 illustrates the circuit structure of a sixteen stage charge pump circuit that combine both first and second embodiments of this invention.

The first and second embodiments of this invention can also be combined to provide advantages of both. FIG. 6 illustrates a sixteen stage charge pump circuit that combines both embodiments. Pump stages of nodes A1 to A8 and A9 to A16 constitute two pump circuits each being configurable as a two or eight stage charge pump.

The pump capacitors C9, C10, . . . , C16 for nodes A9, A10, . . . , A16 are connected to A1, A2, . . . , A8 instead of the pulse train inputs. Therefore, the charge pump circuit is a sixteen stage charge pump that can be configured as a four stage low voltage high current charge pump or a sixteen stage high voltage low current charge pump. The maximum voltage that a pump capacitor has to withstand does not exceed the voltage difference across eight pump stages.

From the forgoing discussion, it can be understood that pump capacitors play an important role in a charge pump circuit. The channel turn-off problem associated with a conventional N-MOS capacitor degrades the efficiency of the charge pump circuits. This invention further provides a new MOS in-well pump capacitor to overcome the problem.

Figure 7A:
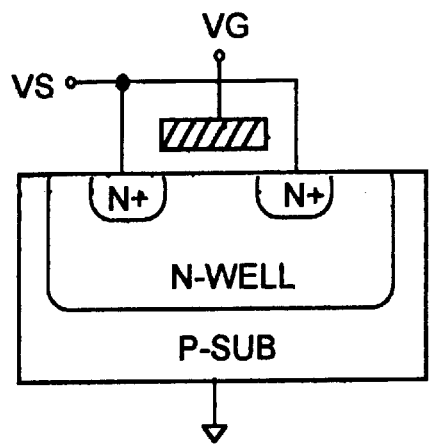
FIGS. 7A–7C show three different pump capacitors according to this invention: (A) an N-well capacitor, (B) an P-Well capacitor, and (C) a P-well capacitor using triple-well technology.
Figure 7B:
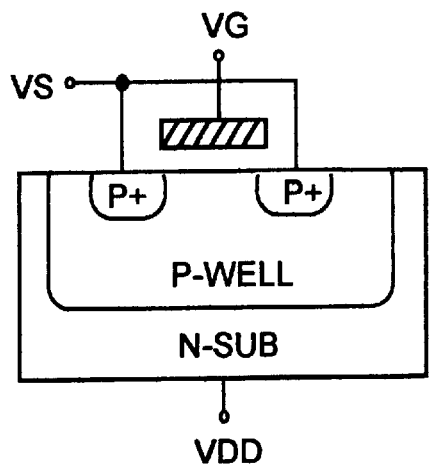

FIG. 7A shows a cross-sectional view of an N-well capacitor of this invention. According to this invention, an N-well is first established in a p-substrate. The pump capacitor is then fabricated by making the two n$^+$ diffusion regions in the N-well. The gate-substrate capacitor that exists in a conventional N-MOS capacitor when the device is turned off no longer exists. Therefore, the N-well capacitor can be used to pump up voltage even if the voltage at the floating gate is negative. The invention is also applicable to a P-MOS capacitor as shown in FIG. 7B in which the P-well capacitor is formed in a P-well within an N-substrate.

Figure 7C:
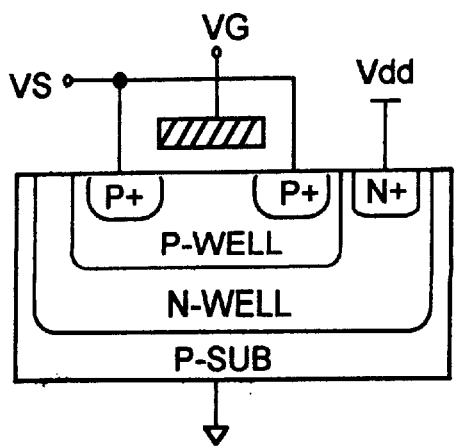

FIG. 7C shows another embodiment of P-well capacitor that employs a triple well technology. As can be seen, an N-well is first formed in a P-substate. The P-well capacitor is then fabricated in the N-well. This technology is generally referred to as triple well technology. An n$^+$ region is also formed in the N-well for connecting to the power supply voltage.

The charge pump circuits for pumping up positive high voltages have been used to explain the present invention. The principle of the circuit can also be applied to charge pump circuits for pumping down negative high voltages. By replacing N-MOS devices with appropriate P-MOS devices or vice versa and applying appropriate power supply voltages, a person skilled in the field can design a charge pump circuit according to the principle of the invention to get positive or negative high voltages.

Although only the preferred embodiments of this invention were shown and described in the above description, various modification or combination that comes within the spirit of this invention may also be made by a person skilled in the field according to the principle described in this disclosure. The examples given above are for the purpose of easy explanation and should not be deemed to limit the scope of the present invention.

What is claimed is:

1. A charge pump circuit comprising:
    two pulse train inputs providing two non-overlapping pulse train signals;
    a first group of N series-coupled pump stages having at least two pump stages, each pump stage of said first group including a MOS device, a node and a pump capacitor having a first end connected to said node and a second end connected to one of said pulse train inputs, wherein adjacent pump stages have pump capacitors connecting to different pulse train inputs; and
    a second group of series-coupled pump stages series-coupled to said first group, each pump stage of said second group including a MOS device, a node and a pump capacitor having a first end connected to said node and a second end connected to the node of a preceding pump stage that is N stage away in said charge pump circuit, said second group having at least one pump stage.

2. The charge pump circuit according to claim 1, wherein said first group has an even number of series-coupled pump stages.

3. The charge pump circuit according to claim 1, wherein the node of each pump stage is further connected through a MOS device to a power supply voltage.

4. The charge pump circuit according to claim 1, wherein the pump capacitor connected to each node comprises a floating gate, a well region formed in a substrate, and two diffusion regions serving as a drain and a source formed in said well region, said substrate and said well region having different doping types and said drain and source being connected together.

5. A charge pump circuit comprising:
    N pulse train inputs providing N pulse train signals;
    a first group of N series-coupled pump stages, each pump stage of said first group including a MOS device, a node and a pump capacitor having a first end connected to said node and a second end connected to one of said N pulse train inputs, wherein each node is AC coupled to a different pulse train input and the node of every even stage is further connected through a MOS device to the output of said pump circuit; and
    a second group of N series-coupled pump stages series-coupled to said first group, each pump stage of said second group including a MOS device, a node and a pump capacitor having a first end connected to said node and a second end connected to one of said N pulse train inputs, wherein each node is AC coupled to a different pulse train input and the node of every even stage is further connected through a MOS device to the output of said pump circuit;
    wherein the first nodes of said first and second groups are AC coupled to a first pulse train input, the second nodes of said first and second groups are AC coupled to a second pulse train input, the third nodes of said first and second groups are AC coupled to a third pulse train input, and so on.

6. The charge pump circuit according to claim 5, wherein N is a power of 2.

7. The charge pump circuit according to claim 5, wherein the node of each pump stage is further connected through a MOS device to a power supply voltage.

8. The charge pump circuit according to claim 5, said pump circuit being built in an integrated circuit and configurable as either a higher voltage charge pump or a lower voltage charge pump for a flash memory array by providing appropriate pulse train signals to said pulse train inputs.

9. The charge pump circuit according to claim 5, wherein the pump capacitor connected to each node comprises a floating gate, a well region formed in a substrate, and two diffusion regions serving as a drain and a source formed in said well region, said substrate and said well region having different doping types and said drain and source being connected together.

10. A charge pump circuit comprising:

N pulse train inputs providing N pulse train signals; and

N series-coupled pump stages, each pump stage including a MOS device, a node and a pump capacitor having a first end connected to said node and a second end connected to one of said N pulse train inputs;

wherein each node is AC coupled to a different pulse train input and each node of the first N-1 pump stages of said pump circuit is further connected through a MOS device to the output of said pump circuit.

11. The charge pump circuit according to claim 10, wherein the node of each pump stage is further connected through a MOS device to a power supply voltage.

12. The charge pump circuit according to claim 10, wherein the pump capacitor connected to each node comprises a floating gate, a well region formed in a substrate, and two diffusion regions serving as a drain and a source formed in said well region, said substrate and said well region having different doping types and said drain and source being connected together.

13. The charge pump circuit according to claim 10, said pump circuit being built in an integrated circuit and configurable as either a higher voltage charge pump or a lower voltage charge pump for a flash memory array by providing appropriate pulse train signals to said pulse train inputs.

14. The charge pump circuit according to claim 10, wherein the node of the last pump stage of said pump circuit is also connected through a MOS device to the output of said pump circuit.

15. The charge pump circuit according to claim 14, wherein the node of each pump stage is further connected through a MOS device to a power supply voltage.

16. The charge pump circuit according to claim 1, wherein the pump capacitor connected to each node comprises a floating gate, a first well region formed within a second well region formed in a substrate, and two diffusion regions serving as a drain and a source formed in said first well region, said substrate and said first well region having a first doping type, said second well region having a second doping type, and said drain and source being connected together.

17. The charge pump circuit according to claim 5, wherein the pump capacitor connected to each node comprises a floating gate, a first well region formed within a second well region formed in a substrate, and two diffusion regions serving as a drain and a source formed in said first well region, said substrate and said first well region having a first doping type, said second well region having a second doping type, and said drain and source being connected together.

18. The charge pump circuit according to claim 10, wherein the pump capacitor connected to each node comprises a floating gate, a first well region formed within a second well region formed in a substrate, and two diffusion regions serving as a drain and a source formed in said first well region, said substrate and said first well region having a first doping type, said second well region having a second doping type, and said drain and source being connected together.

* * * * *